(12) United States Patent
Kneib et al.

(10) Patent No.: US 11,606,224 B2
(45) Date of Patent: Mar. 14, 2023

(54) METHOD FOR CHECKING A MESSAGE IN A COMMUNICATION SYSTEM

(71) Applicant: Robert Bosch GmbH, Stuttgart (DE)

(72) Inventors: Marcel Kneib, Ingelheim (DE); Oleg Schell, Krautheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/453,054

(22) Filed: Nov. 1, 2021

(65) Prior Publication Data

US 2022/0173936 A1   Jun. 2, 2022

(30) Foreign Application Priority Data

Nov. 27, 2020   (DE) ................ 10 2020 214 946.1

(51) Int. Cl.
*H04L 12/40* (2006.01)
*H03M 1/82* (2006.01)
*H03L 7/14* (2006.01)

(52) U.S. Cl.
CPC ........ *H04L 12/40013* (2013.01); *H03L 7/148* (2013.01); *H03M 1/82* (2013.01); *H04L 12/40058* (2013.01); *H04L 2012/40215* (2013.01)

(58) Field of Classification Search
CPC ......... H04L 12/40013; H04L 12/40058; H04L 2012/40215; H04L 12/40; H04L 63/126; H03L 7/148; H03M 1/82
See application file for complete search history.

(56) References Cited

U.S. PATENT DOCUMENTS

| | | | |
|---|---|---|---|
| 2019/0184775 A1* | 6/2019 | Van Wiemeersch | ........................ H04W 12/033 |
| 2022/0030014 A1* | 1/2022 | Potluri | ................ H04L 63/1491 |

* cited by examiner

*Primary Examiner* — Luat Phung
(74) *Attorney, Agent, or Firm* — Norton Rose Fulbright US LLP; Gerard Messina

(57) ABSTRACT

A method for checking a message in a communication system, in which multiple users are connected to a communication medium that includes two signal lines and exchange messages via same. A time difference between points in time of reception of a message that is sent on the communication medium is ascertained at two different, predefined positions on the communication medium, and based on a comparison of the time difference to at least one reference time difference, it is determined whether the message originates from a verified user. During the ascertainment of the time difference at the two positions, in each case a difference signal is formed from signals that have resulted on the two signal lines due to the message.

10 Claims, 3 Drawing Sheets

METHOD FOR CHECKING A MESSAGE IN A COMMUNICATION SYSTEM

CROSS REFERENCE

The present application claims the benefit under 35 U.S.C. § 119 of German Patent Application No. DE 102020214946.1 filed on Nov. 27, 2020, which is expressly incorporated herein by reference in its entirety.

FIELD

The present invention relates to a method for checking a message in a communication system, as well as a processing unit and a computer program for carrying out same.

BACKGROUND INFORMATION

Increasing digitization results in ever-greater use of wireless interfaces in everyday products or systems such as vehicles. Despite numerous advantages, such interfaces also provide increasing options for intrusions. One particular problem is, for example, intrusions into electronic control units (ECUs), which in vehicles are responsible for various functions and the data exchange via vehicle-internal communication systems. An intruder may be enabled, for example, to influence safety-critical functions such as the steering, the brakes, or an engine control. Typical communication systems or communication media used in vehicles, for example, such as the CAN bus, via which such intrusions could be prevented, have been designed without safety measures per se.

Thus, an intruder, for example by connecting an additional device or by influencing existing control units on the communication medium, may impersonate another user and transfer unauthorized messages. Due to the mentioned lack of safety measures for the CAN protocol, for example, such identity theft may be successfully carried out, since the (other) users cannot check the authenticity of the transferred messages.

SUMMARY

According to the present invention, a method for checking a message in a communication system as well as a processing unit and a computer program for carrying out same, are provided. Advantageous embodiments of the present invention are described herein.

The present invention relates to the checking of a message in a communication system, in which multiple users are connected to a communication medium and exchange messages via same. The present invention is based in particular on communication media that include two signal lines, as is the case for a CAN bus, for example. This is to be discussed in greater detail below.

The problem of the lack of safety measures for communication media such as a CAN bus is generally known. To solve this problem, for example physical properties of the individual users (which are typically control units here) are utilized to identify the source of a transferred message. For example, for a clock-based intrusion detection system (so-called CIDS), the individual clock offsets of each user during the periodic message transfer are used to draw conclusions concerning the authenticity of the sender. These clock offsets may be used to recognize deviations from and anomalies of the previously observed transfer behavior, which in turn indicate an unauthorized origin of a message.

However, as a result, aperiodic messages cannot be evaluated, and an intruder is also able to circumvent the system by observing the clock offset on the communication medium and subsequently adapting his/her transfers to the offset of the user to be imitated.

In addition, intrusion detection systems may be used which build on specific voltage properties of individual users during their transfer operations. A model of the voltage signature may be created from authorized messages and compared to the voltage signatures that are observed during the normal message exchange. Although good results for the detection accuracy may generally be achieved, voltage fluctuations due to temperature changes are problematic. In addition, high resource requirements are generally necessary for this purpose due to a comprehensive analysis of the voltage signal.

Existing approaches for providing authentication, which are based on physical properties such as internal clocks or voltages, either impose high demands on the computing resources, are not robust against signal fluctuations, or may be circumvented by a sophisticated intrusion.

In the procedure provided within the scope of an example embodiment of the present invention, a time difference between points in time of reception of a message that is sent on the communication medium is now ascertained at two different, predefined positions on the communication medium. Only the difference, not the absolute values, of the two propagation times of the message from the sending user up to the two positions is/are relevant, i.e., a propagation time difference. This may be determined via a detection means (i.e., a detector) which, with an appropriately designed connection, detects the message at the two positions. Based on a comparison of the time difference to at least one reference time difference, it is then determined whether the message originates from a verified user. Such reference time differences may be ascertained via test measurements, for example, in which it is ensured that an intruder does not alter or even send a message on the communication medium.

If the time difference deviates from a reference time difference by less than a predefined threshold value, for example, it may be determined or assumed that the message originates from a verified user. Otherwise, it may be determined or assumed that the message does not originate from a verified user, and in particular an intrusion attempt into the communication system is present. In general, a suitable model may also be used to carry out the comparison. Such a model describes, in particular for a plurality of users or the entire communication system, the associated differences in the propagation time differences, and may then be used to "verify" a propagation time difference that is subsequently measured for a certain user (or multiple or all users).

The mentioned time difference must be detected in order to determine the necessary propagation difference for the model formation and the intrusion detection. In particular the use of a so-called time-to-digital converter (TDC), which typically is particularly cost-effective, is advantageous, especially since the time difference may be determined particularly easily and quickly, while the requirement for high-performance scanning hardware such as a fast analog-digital converter (ADC) is dispensed with. In addition, the computing time for computing and assessing the time difference is relatively low, since simpler techniques may be used for the comparison. Likewise, the detection means may be implemented as an independent circuit, for example.

As mentioned, the present invention relates to communication media that include two signal lines. For the CAN bus, these are, for example, two dedicated wires, a so-called CAN high line (CAN H) and a so-called CAN low line (CAN L), via which the messages are encoded and transferred. These two wires are in no-load operation, and for the transfer of a 1 bit are activated at a voltage of 2.5 V, while the CAN high line for 0 bit transfers is activated to (at least) 3.5 V and the CAN low line is activated to (at most) 1.5 V.

It could be considered to connect the ends of CAN H or CAN L directly to a detection means such as the TDC or in general to a propagation difference determination component (PDDC), which, however, could result in problems. The individual wires in the automobile surroundings are affected by electromagnetic interferences (EMIs), which may result in strong voltage fluctuations and incorrectly recognized bit transfers by the detection means. If standard hardware is considered, instead of designing a specific circuit, operating voltages that sometimes do not match the voltages that are present on individual CAN channels are typically predefined by the manufacturer.

Against this background, it is provided that during the ascertainment of the time difference at the two positions, in each case a difference signal is formed from signals that have resulted on the two signal lines due to the message. Thus, in the case of the CAN bus, a differential CAN signal that is basically a subtraction of the CAN L signal from the CAN H signal is formed as the difference of the signals. Since the voltages at the CAN H and CAN L lines are influenced in opposite directions by electromagnetic interferences, the resulting voltage fluctuations are canceled out due to the subtractions, resulting in a robust difference signal free of interference. This may be implemented, for example, by a so-called signal transceiver (CAN transceiver, for example) that is then used in the employed circuit or processing unit. A signal transceiver is typically situated in each control device or in each control unit that is connected to a bus. However, a dedicated subtraction logic system (in an appropriately designed circuit, for example) may also be used.

If the voltages of this signal match the operating voltages of the PDDC or of the detection means used (TDC, for example), the two signal lines may then be directly connected. Otherwise, a voltage adjustment, which may take place upstream from the PDDC via a voltage divider, for example, is necessary.

One possible problem is the risk that, due to the communication architecture and topology or other artifacts, the difference signal may have different rise times at the two positions of the communication medium at which the signals are detected. This has direct effects, for example, on the two CAN transceivers, which typically have a static threshold for the level of the difference signal above which a bit transfer is output. If this activation threshold is in a range in which the signal rise times are influenced by these artifacts, an incorrect value for the time difference would be ascertained.

Therefore, it is preferred that at at least one of the two positions a threshold value for a signal level is predefined during the detection of the difference signal, and the difference signal is assumed to be recognized when this threshold value is exceeded. For this purpose, for example a comparator may be used via which the difference signal is compared to the threshold value. The threshold value is particularly preferably individually and optionally also dynamically predefined for the position in question, for example using a digital-to-analog converter (DAC). This is also particularly suitable when a threshold value is predefined for both positions, which then may also differ from one another.

The problem that an incorrect time difference is measured is thus avoided or at least reduced. To maintain the robustness of the difference signal, which is computed by the CAN transceiver, for example, a specialized circuit may then be provided which computes the subtraction on a voltage level basis. This could be achieved, for example, using two (or also more or fewer) operational amplifiers or comparators for each CAN H-CAN L pair. To be able to provide a dynamic threshold value, for each individual difference signal a comparator may be used which compares the difference signal to a reference voltage (the threshold value). In this way, the threshold value via which a bit transfer is output may be set with the aid of the reference voltage.

It should be noted that this reference voltage may be statically set to the desired value, while with the aid of digital-to-analog converters, for example, there is a dynamic option, already present even for simple microcontrollers, to set the reference voltage. By the use of digital-to-analog converters, there is also the option to automatically determine the best threshold value via which the differentiation of individual propagation differences is maximized. By measuring the time differences of messages of each user using a plurality of different threshold values, a suitable threshold value for the digital-to-analog converter may be selected and ultimately established, thus achieving the best separation between all sending users on the communication medium. This implementation option offers the greatest flexibility with regard to accuracy and robustness, although at the expense of a specialized circuit. In this case, it is also to be taken into account that the additional components should be suitable for the automotive field, if this is the area of application, which means, for example, that the comparator must have a low switching latency and a small variation range.

A processing unit according to the present invention, for example a control unit of a motor vehicle or a circuit system specifically designed for this purpose, is in particular configured to carry out a method according to the present invention, in particular by programming.

In addition, implementing a method in the form of a computer program or computer program product including program code for carrying out all method steps is advantageous, since this involves particularly Low costs, in particular when an operating control unit is also utilized for further tasks, and therefore is present anyway. Suitable data media for providing the computer program are in particular magnetic, optical, and electrical memories such as hard disks, flash memories, EEPROMs, DVDs, and others. In addition, downloading a program via computer networks (Internet, Intranet, etc.) is possible.

Further advantages and embodiments of the present invention result from the description herein and the figures.

The present invention is schematically illustrated in the drawings based on exemplary embodiments, and described below with reference to the figures.

DETAILED DESCRIPTION OF EXAMPLE EMBODIMENTS

Figure 1:
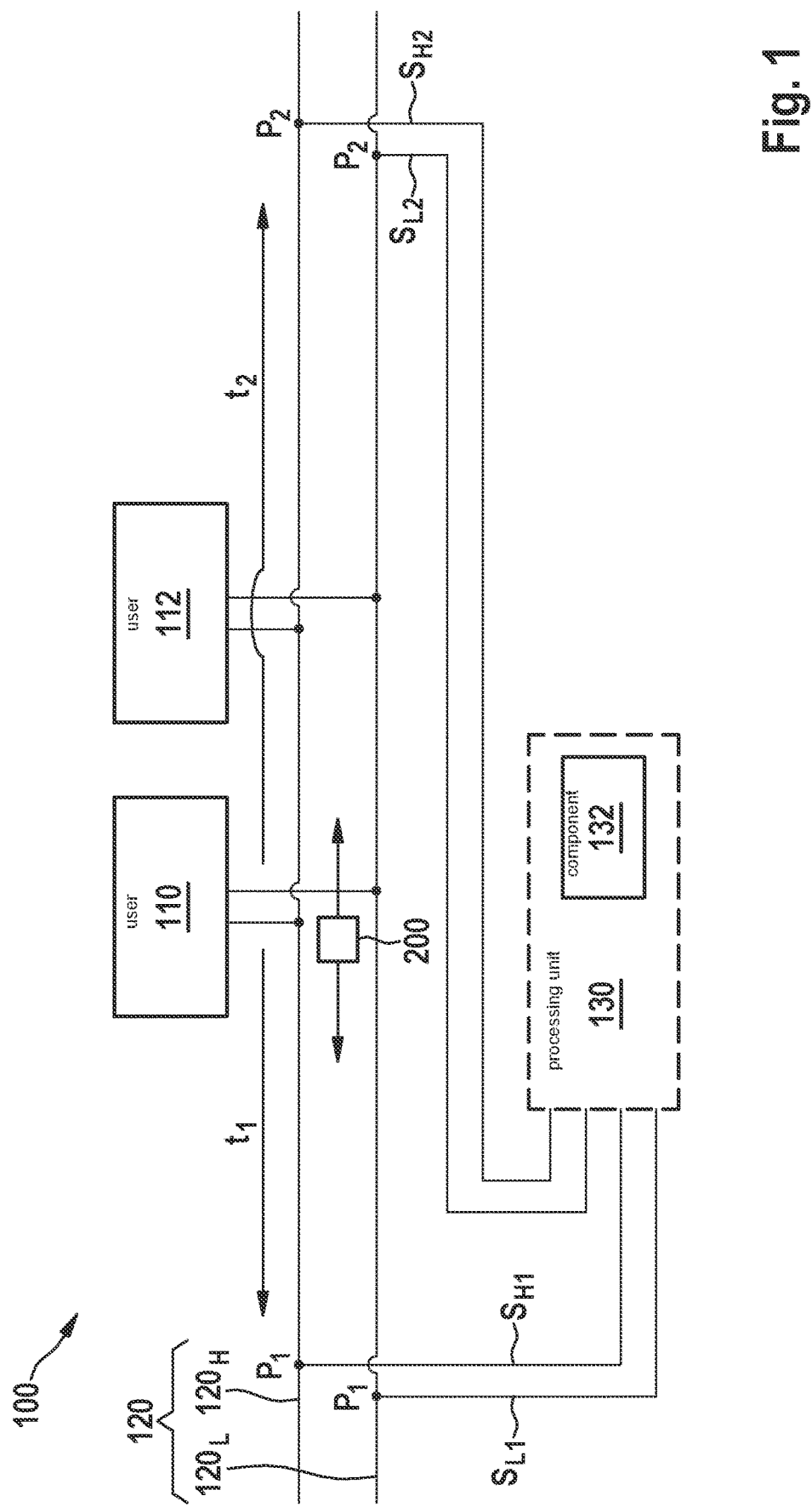
FIG. 1 schematically shows a communication system in which a method according to the present invention may be carried out.

FIG. 1 schematically illustrates a communication system in which a method according to the present invention may be carried out. For this purpose, communication system 100 is shown with two users 110, 112 by way of example, which are connected or attached to a communication medium 120. Users 110, 112 may be, for example, control units in a vehicle. Communication medium 120, which is a CAN bus, for example, includes two signal lines $120_H$ and $120_L$, which in the case of the CAN bus are also denoted as CAN high and CAN low.

In addition, a processing unit or circuit system 130 is shown which is configured and used for ascertaining a time difference between points in time of reception of a message that is sent on the communication medium, at two different, predefined positions $P_1$ and $P_2$ on communication medium 120 (these positions are valid in each case for both signal lines, which in practice are usually twisted). The message is indicated here by reference numeral 200. The two points in time of reception are indicated by reference symbols $t_1$ and $t_2$, and in particular with user 110 as sender. For this purpose, processing unit 130 may be connected to communication medium 120 or to the two signal lines at positions $P_1$ and $P_2$ in order to receive the signals in question.

The signal of line $120_H$ at position $P_1$ is denoted by reference symbol $S_{H1}$, the signal of line $120_L$ at position $P_1$ is denoted by reference symbol $S_{L1}$, the signal of line $120_H$ at position $P_2$ is denoted by reference symbol $S_{H2}$, and the signal of line $120_L$ at position $P_2$ is denoted by reference symbol $S_{L2}$.

For implementing the functions mentioned above, a component 132, by use of which the time difference on the communication medium may be determined, may be provided in processing unit 130. This component is also referred to below as a propagation difference determination component (PDDC). The PDDC could include, for example, a TDC or an independent circuit that measures the time difference between two signals at the two positions, for example also the ends, of the communication medium based on an internal timer, for example. Processing unit or circuit system 130 is explained in greater detail below, namely, in two different preferred variants.

Figure 2:
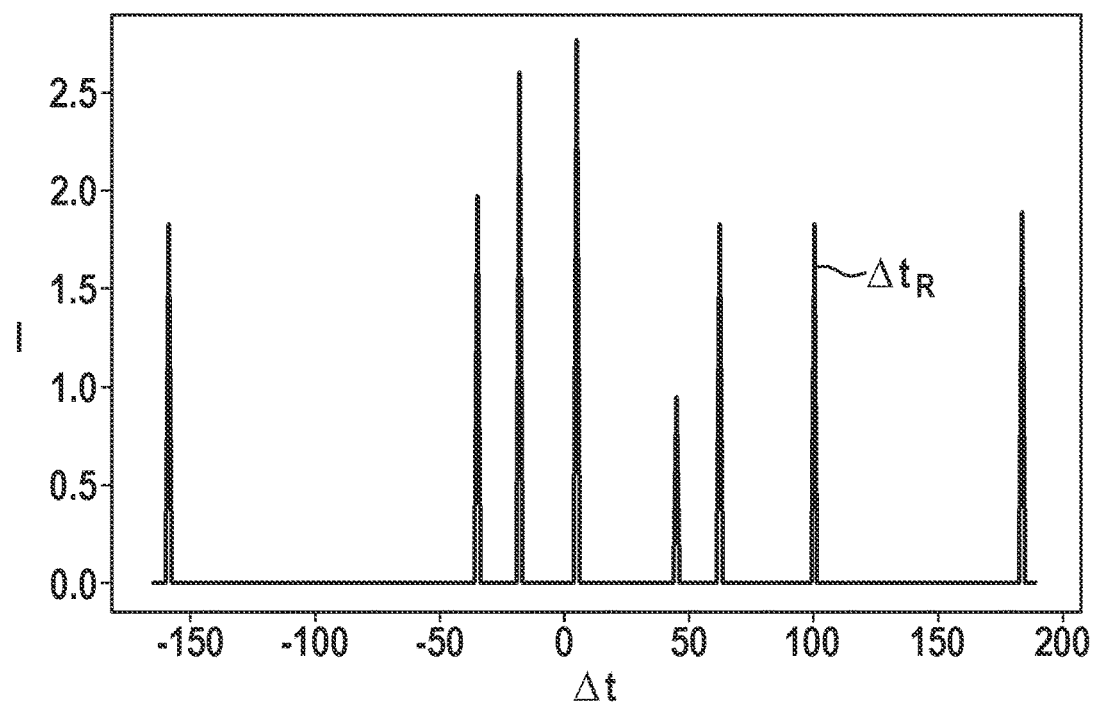
FIG. 2 shows a diagram including reference time differences as may be used in a method according to an example embodiment of the present invention.

FIG. 2 illustrates a diagram by way of example, including reference time differences as may be used in a method according to the present invention, namely, as a probability distribution model of eight senders or users on the communication medium, using a Gaussian distribution. For this purpose, a probability density is plotted as a function of a time difference $\Delta t$ (in ns by way of example). As an example, a reference time difference is denoted by reference symbol $\Delta t_R$. If the time difference, ascertained for a message within the scope of the present invention, corresponds to one of the reference time differences or, for example, differs therefrom at least [by] less than a threshold value, it may be assumed that the message has been sent by a verified user.

Figure 3:
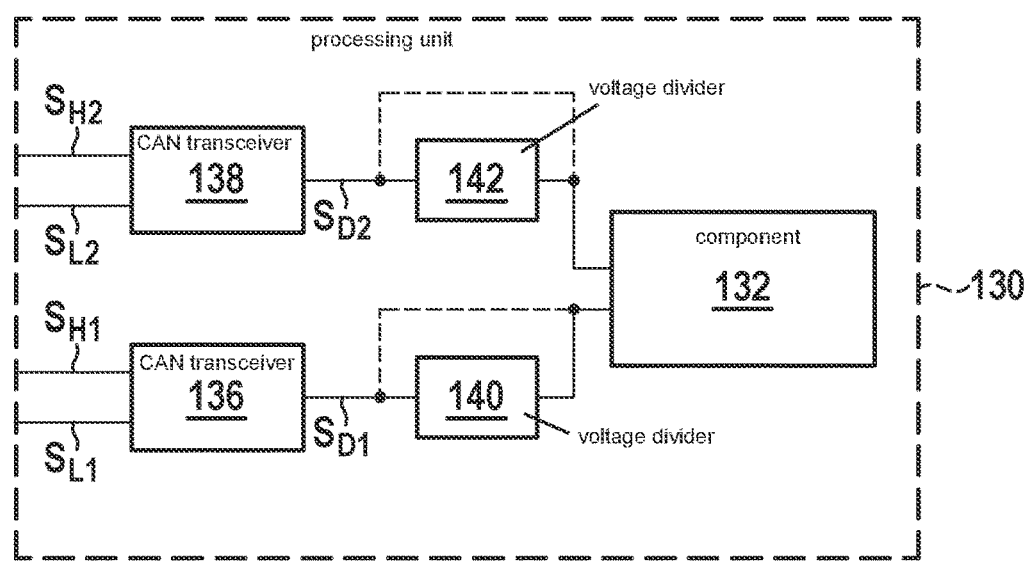
FIG. 3 shows a circuit system for carrying out a method of the present invention in one preferred specific embodiment.

FIG. 3 illustrates a circuit system 130 for carrying out a method according to the present invention in one preferred specific embodiment. The circuit system may be circuit system or processing unit 130 shown in FIG. 1. In particular, the four incoming signals $S_{H1}$, $S_{L1}$, $S_{H2}$, and $S_{L2}$ are also shown. With the aid of detection means (i.e., detector(s)) such as CAN transceivers 136, 138, a difference or a difference signal $S_{D1}$ or $S_{D2}$ may be formed from signals that are in each case associated with a position. If the voltage level of the signals is appropriate for PDDC 132, the signals may be directly passed on to the PDDC, as indicated by dashed lines. Otherwise, in each case a voltage divider 140, 142 may be provided in order to appropriately adapt the voltage level.

In this way, based on the two difference signals, the time difference for message 200 that is sent on the CAN bus may be ascertained in order to determine whether the message originates from a verified user. As mentioned above, this operation functions in particular when it may be assumed that the difference signals have comparable rising edges. If this is not the case, another variant may be used, as explained below.

Figure 4:
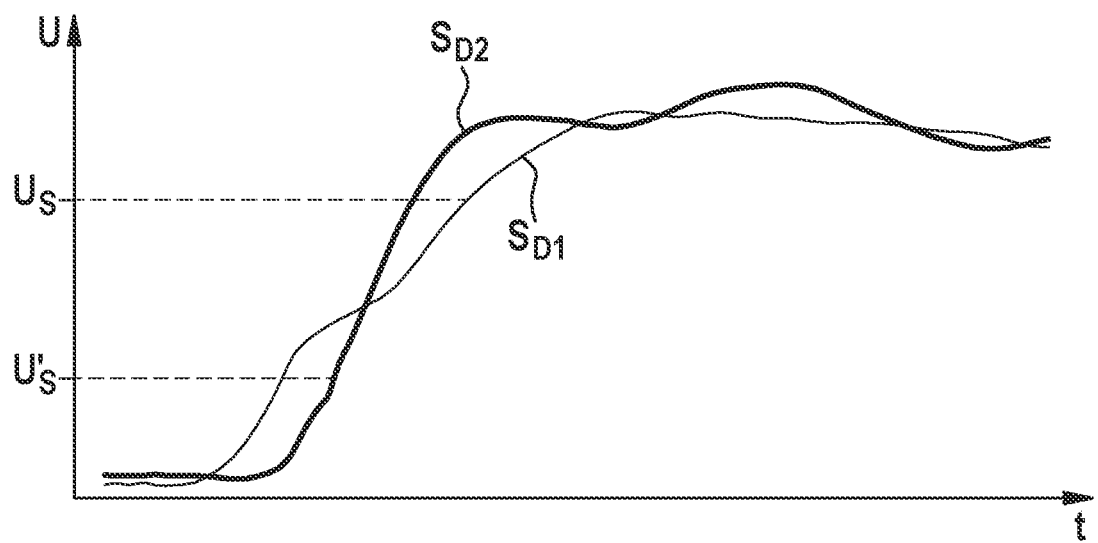
FIG. 4 shows signal patterns for explaining a method according to the present invention in a further preferred specific embodiment.

FIG. 4 illustrates signal patterns for explaining a method according to the present invention in a further preferred specific embodiment, namely, signal patterns of two difference signals $S_{D1}$ and $S_{D2}$ as voltage U plotted as a function of time t. The two signal patterns rise in a time-offset manner, but initially each with approximately the same slope. The time offset results, for example, from the different propagation times of the message up to the two positions, as mentioned above.

However, as is further apparent, the slope of difference signal $S_{D1}$ changes, so that this difference signal is even overtaken by difference signal $S_{D2}$. If the CAN transceivers as shown in FIG. 2 or some other detection means regard the difference signal as recognized for a certain, fixedly predefined threshold value $U_S$, the points in time of reception and thus the time difference may possibly be incorrectly recognized.

Figure 5:
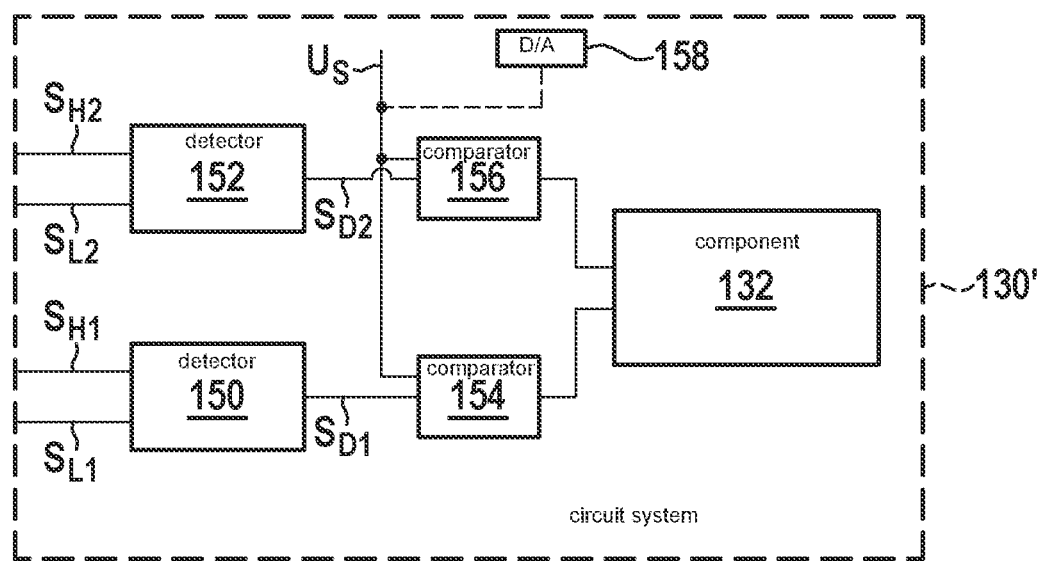
FIG. 5 shows a circuit system for carrying out a method according to the present invention in a further preferred specific embodiment.

FIG. 5 illustrates a circuit system 130' for carrying out a method according to the present invention in a further preferred specific embodiment. This circuit system 130' may likewise be used as processing unit or circuit system 130 shown in FIG. 1.

Here as well, difference signals $S_{D1}$ and $S_{D2}$ are formed, initially with the aid of detection means (detectors) 150, 152, which are dedicated subtraction logic systems or corresponding circuits, for example. These difference signals are then supplied to a comparator 154 or 156, respectively, which also obtains a signal for a threshold value $U_S$, above which the particular difference signal is to be considered as recognized. As indicated by the dashed line, this threshold value $U_S$ may also be dynamically determined and predefined with the aid of a digital-to-analog converter 158, for example.

In this way, threshold value $U_S$ may be adapted and set, for example, to value $U'_S$ as shown in FIG. 4. It is also conceivable to use different threshold values for the two comparators 154, 156. The individual circumstances of the communication medium, which influences the signal propagation as shown in FIG. 4, may thus be taken into account.

What is claimed is:

1. A method for checking a message in a communication system, in which multiple users are connected to a communication medium that includes two signal lines and exchange messages via the communication medium, the method comprising the following steps:

ascertaining a time difference between points in time of reception of a message that is sent on the communication medium at two different, predefined positions on the communication medium;

based on a comparison of the time difference to at least one reference time difference, determining whether the message originates from a verified user; and during the ascertainment of the time difference at the two positions, at each of the two positions, forming a difference signal from signals that resulted on the two signal lines due to the message.

2. The method as recited in claim 1, wherein a voltage level of the difference signal is adapted to a time-to-digital converter (TDC) using a voltage divider.

3. The method as recited in claim 1, wherein at at least one of the two positions, a threshold value for a signal level is predefined during the detection of the difference signal, and the difference signal is assumed to be recognized when the threshold value is exceeded.

4. The method as recited in claim 3, wherein a comparator is used via which the difference signal is compared to the threshold value.

5. The method as recited in claim 3, wherein the threshold value is individually predefined for each of the at least one of the two positions, and is also automatically determined.

6. The method as recited in claim 5, wherein the threshold value is predefined using a digital-to-analog converter.

7. The method as recited in claim 1, wherein a signal transceiver or a dedicated subtraction logic system is used to form the difference signal.

8. The method as recited in claim 1, wherein the communication medium is a CAN bus, or a CAN FD bus, or a CAN XL bus, or a 10BASE-T1S bus.

9. A processing unit configured to check a message in a communication system, in which multiple users are connected to a communication medium that includes two signal lines and exchange messages via the communication medium, the processing unit configured to:

ascertain a time difference between points in time of reception of a message that is sent on the communication medium at two different, predefined positions on the communication medium;

based on a comparison of the time difference to at least one reference time difference, determine whether the message originates from a verified user; and during the ascertainment of the time difference at the two positions, at each of the two positions, a difference signal is formed from signals that resulted on the two signal lines due to the message.

10. A non-transitory machine-readable memory medium on which is stored a computer program for checking a message in a communication system, in which multiple users are connected to a communication medium that includes two signal lines and exchange messages via the communication medium, the computer program, when executed on a processing unit, causing the processing unit to perform method comprising the following steps:

ascertaining a time difference between points in time of reception of a message that is sent on the communication medium at two different, predefined positions on the communication medium;

based on a comparison of the time difference to at least one reference time difference, determining whether the message originates from a verified user; and during the ascertainment of the time difference at the two positions, at each of the two positions, forming a difference signal from signals that resulted on the two signal lines due to the message.

\* \* \* \* \*